(12) United States Patent
Presti et al.

(10) Patent No.: US 8,786,373 B2
(45) Date of Patent: Jul. 22, 2014

(54) ADJUSTABLE BYPASS CIRCUIT FOR A SUPPLY VOLTAGE FOR AN AMPLIFIER

(76) Inventors: Calogero D. Presti, San Diego, CA (US); Jose Cabanillas, San Diego, CA (US)

(*) Notice: Subject to any disclaimer, the term of this patent is extended or adjusted under 35 U.S.C. 154(b) by 122 days.

(21) Appl. No.: 13/401,255

(22) Filed: Feb. 21, 2012

(65) Prior Publication Data

US 2013/0214862 A1 Aug. 22, 2013

(51) Int. Cl.
*H03F 3/08* (2006.01)
(52) U.S. Cl.
USPC ............ 330/308; 330/127; 330/297; 330/302
(58) Field of Classification Search
USPC ................................. 330/127, 297, 302, 308
See application file for complete search history.

(56) References Cited

U.S. PATENT DOCUMENTS

| | | | | |
|---|---|---|---|---|
| 2,807,774 A | * | 9/1957 | Dudziak et al. | 323/291 |
| 3,024,391 A | * | 3/1962 | Ford | 361/187 |
| 3,573,502 A | * | 4/1971 | Kan | 327/170 |
| 5,182,527 A | | 1/1993 | Nakanishi et al. | |
| 5,742,206 A | * | 4/1998 | Ishida | 330/284 |
| 6,351,189 B1 | * | 2/2002 | Hirvilampi | 330/296 |
| 6,462,620 B1 | | 10/2002 | Dupuis et al. | |
| 8,014,719 B2 | | 9/2011 | Moloudi et al. | |
| 2006/0178119 A1 | | 8/2006 | Jarvinen et al. | |
| 2010/0321129 A1 | | 12/2010 | Onody et al. | |
| 2011/0227666 A1 | | 9/2011 | Manssen et al. | |
| 2012/0146731 A1 | | 6/2012 | Khesbak | |

OTHER PUBLICATIONS

International Search Report and Written Opinion—PCT/US2013/027193—ISA/EPO—Jun. 5, 2013.

* cited by examiner

*Primary Examiner* — Patricia Nguyen
(74) *Attorney, Agent, or Firm* — Ramin Mobarhan

(57) ABSTRACT

Techniques for bypassing a supply voltage for an amplifier are disclosed. In an exemplary design, an apparatus includes an amplifier and an adjustable bypass circuit. The amplifier (e.g., a power amplifier) receives a supply voltage from a supply source. The adjustable bypass circuit is coupled to the supply source and provides bypassing for the supply voltage. The adjustable bypass circuit includes an adjustable capacitor or a fixed capacitor coupled to an adjustable resistor. The supply source may be (i) a power supply source providing a fixed supply voltage for the amplifier or (ii) an envelope tracker providing a variable supply voltage for the amplifier.

19 Claims, 12 Drawing Sheets

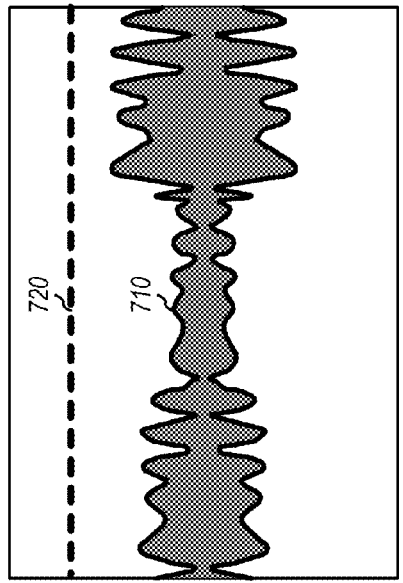
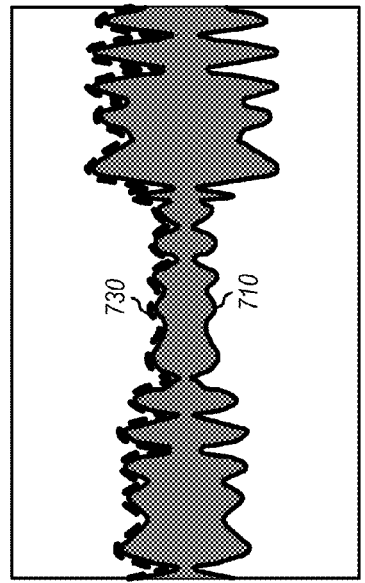
FIG. 7A  FIG. 7B
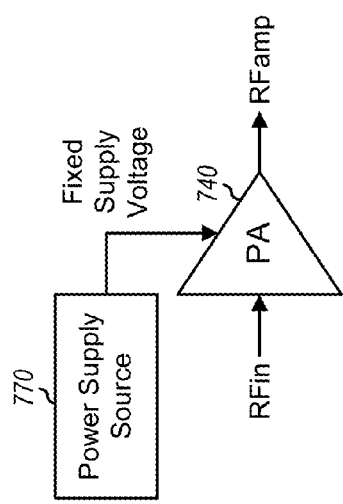
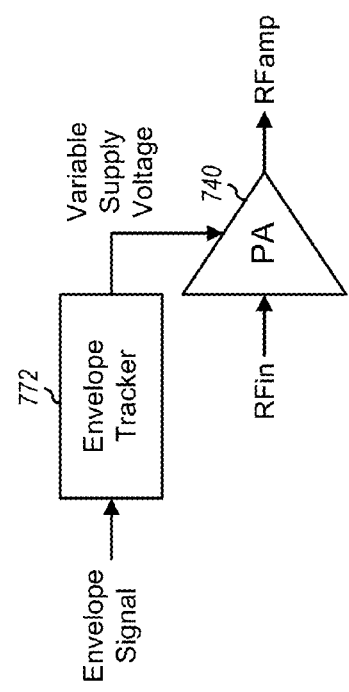

US 8,786,373 B2

ADJUSTABLE BYPASS CIRCUIT FOR A SUPPLY VOLTAGE FOR AN AMPLIFIER

BACKGROUND

I. Field

The present disclosure relates generally to electronics, and more specifically to techniques for bypassing a supply voltage for an amplifier.

II. Background

Amplifiers are commonly used to amplify signals to obtain the desired signal level. Amplifiers are also widely used for various applications such as communication, computing, networking, consumer electronics, etc. Amplifiers of different types are also used for different purposes. For example, a wireless communication device may include a power amplifier (PA) in a transmitter to amplify a signal prior to transmission via a wireless channel and a low noise amplifier (LNA) in a receiver to amplify a signal received via the wireless channel.

An amplifier is typically connected to a power supply source, which provides a supply voltage that supports the operation of the amplifier. Ideally, the power supply source should have zero output impedance, and the supply voltage should contain only a direct current (DC) voltage and no undesired signals or noise. However, the output impedance of the power supply source is not zero, and the supply voltage typically includes some undesired signals and noise. These non-ideal characteristics of the power supply source and the supply voltage may adversely impact the performance of the amplifier.

BRIEF DESCRIPTION OF THE DRAWINGS

FIG. 7A shows use of a fixed supply voltage for a power amplifier.

FIG. 7B shows use of a variable supply voltage for a power amplifier.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Techniques for bypassing a supply voltage for an amplifier are disclosed herein. Bypassing refers to filtering of a supply voltage to reduce/attenuate noise and/or undesired signals. The techniques described herein may be used for various types of amplifiers such as power amplifiers, driver amplifiers, variable gain amplifiers, low noise amplifiers, etc. The techniques may also be used for various electronic devices such as wireless communication devices, computing devices, consumer electronic devices, etc. For clarity, the use of the techniques for a wireless communication device is described below.

Figure 1:
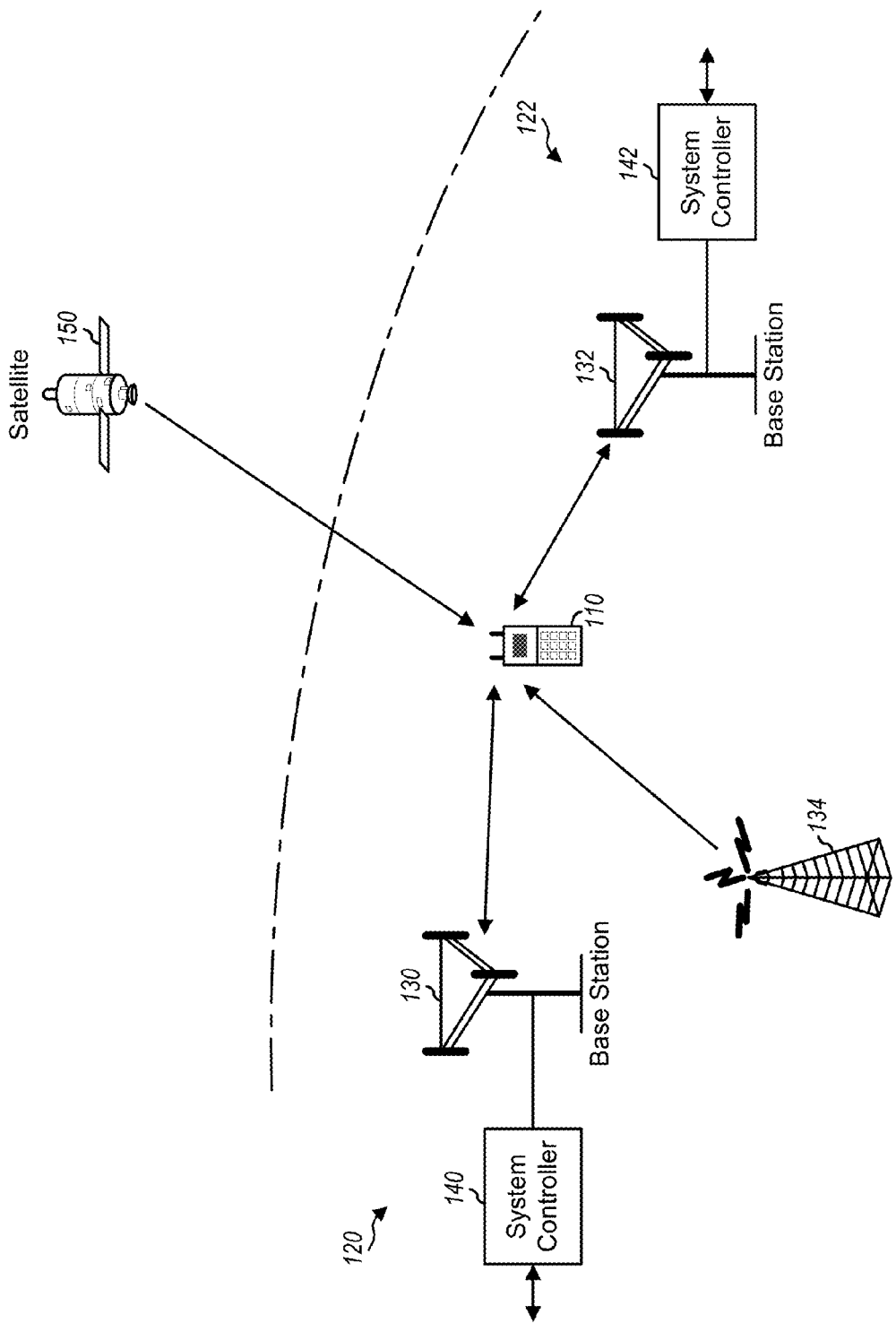
FIG. 1 shows a wireless device capable of communicating with different wireless communication systems.

FIG. 1 shows a wireless device 110 capable of communicating with different wireless communication systems 120 and 122. Wireless systems 120 and 122 may each be a Code Division Multiple Access (CDMA) system, a Global System for Mobile Communications (GSM) system, a Long Term Evolution (LTE) system, a wireless local area network (WLAN) system, or some other wireless system. A CDMA system may implement Wideband CDMA (WCDMA), cdma2000, or some other version of CDMA. For simplicity, FIG. 1 shows wireless system 120 including one base station 130 and one system controller 140, and wireless system 122 including one base station 132 and one system controller 142. In general, each wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smart phone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may be capable of communicating with wireless system 120 and/or 122. Wireless device 110 may also be capable of receiving signals from broadcast stations (e.g., a broadcast station 134). Wireless device 110 may also be capable of receiving signals from satellites (e.g., a satellite 150) in one or more global navigation satellite systems (GNSS). Wireless device 110 may support one or more radio technologies for wireless communication such as LTE, cdma2000, WCDMA, GSM, 802.11, etc.

Figure 2:
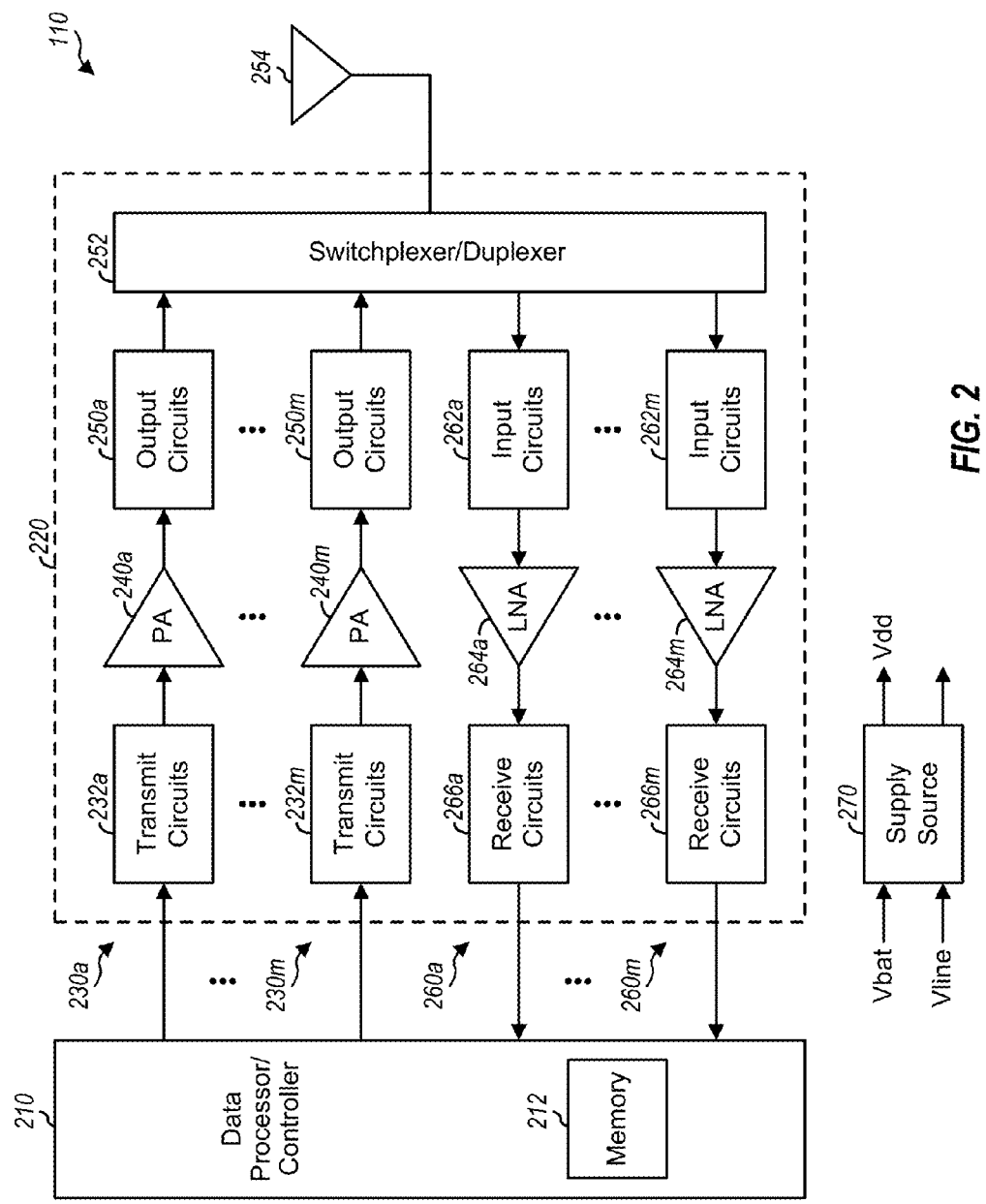
FIG. 2 shows a block diagram of the wireless device in FIG. 1.

FIG. 2 shows a block diagram of an exemplary design of wireless device 110 in FIG. 1. In this exemplary design, wireless device 110 includes a data processor/controller 210, a transceiver 220 coupled to an antenna 254, and a supply source 270. In the exemplary design shown in FIG. 2, transceiver 220 includes M transmitters 230a to 230m and M receivers 260a to 260m, where M may be any integer value. In general, a transceiver may include any number of transmitters and any number of receivers to support wireless communication on any number of frequency bands, any number of radio technologies, and any number of antennas.

In the exemplary design shown in FIG. 2, each transmitter 230 includes transmit circuits 232, a power amplifier (PA) 240, and output circuits 250. For data transmission, data processor 210 processes (e.g., encodes and modulates) data to be transmitted and provides an analog output signal to a selected transmitter. The description below assumes that transmitter 230a is the selected transmitter. Within transmitter 230a, transmit circuits 232a amplify, filter, and upconvert the analog output signal from baseband to radio frequency (RF) and provide a modulated RF signal. Transmit circuits 232a may include amplifiers, filters, mixers, impedance matching circuits, an oscillator, a local oscillator (LO) generator, a phase locked loop (PLL), etc. power amplifier 240a receives and amplifies the modulated RF signal and provides an amplified RF signal having the proper output power level. Output circuits 250a receive the amplified RF signal from power amplifier 240a and provide an output RF signal. Output circuits 250a may include a transmit filter, an impedance matching circuit, a directional coupler, etc. The output RF signal is routed through a switchplexer/duplexer 252 and transmitted via antenna 254.

In the exemplary design shown in FIG. 2, each receiver 260 includes input circuits 262, an LNA 264, and receive circuits 266. For data reception, antenna 254 receives signals from base stations and/or other transmitter stations and provides a received RF signal, which is routed through switchplexer/duplexer 252 and provided to a selected receiver. The description below assumes that receiver 260a is the selected receiver. Within receiver 260a, input circuits 262a process the received RF signal and provide a receiver input signal. Input circuits 262a may include a receive filter, an impedance matching circuit, etc. LNA 264a amplifies the receiver input signal from input circuits 262a and provides an LNA output signal. Receive circuits 266a amplify, filter, and downconvert the LNA output signal from RF to baseband and provide an analog input signal to data processor 210. Receive circuits 266a may include amplifiers, filters, mixers, impedance matching circuits, an oscillator, an LO generator, a PLL, etc.

FIG. 2 shows an exemplary design of transmitters 230 and receivers 260. A transmitter and a receiver may also include other circuits not shown in FIG. 2, such as filters, impedance matching circuits, etc. All or a portion of transceiver 220 may be implemented on one or more analog integrated circuits (ICs), RF ICs (RFICs), mixed-signal ICs, etc. For example, transmit circuits 232, power amplifiers 240, LNAs 264, and receive circuits 266 may be implemented on an RFIC. Power amplifiers 240 and possibly other circuits may also be implemented on a separate IC or circuit module.

Data processor/controller 210 may perform various functions for wireless device 110. For example, data processor 210 may perform processing for data being transmitted via transmitters 230 and received via receivers 260. Controller 210 may control the operation of transmit circuits 232, receive circuits 266, switchplexer/duplexer 252, etc. A memory 212 may store program codes and data for data processor/controller 210. Data processor/controller 210 may be implemented on one or more application specific integrated circuits (ASICs) and/or other ICs.

Supply source 270 may receive a battery voltage (Vbat) from a battery (not shown in FIG. 2) and/or a line voltage (Vline) from an external supply source. Supply source 270 may generate a fixed supply voltage (Vdd) and/or a variable supply voltage for various circuits within transceiver 220. Supply source 270 may also generate other supply voltages for data processor/controller 210 and/or other circuits within transceiver 220.

Figure 3:
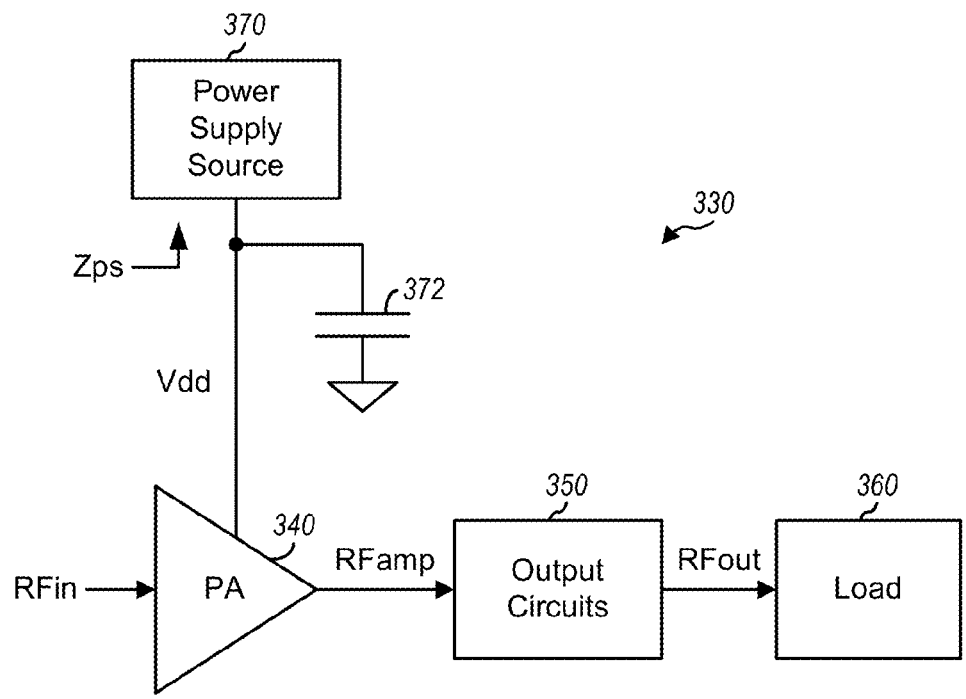
FIG. 3 shows a block diagram of a transmitter.

FIG. 3 shows a block diagram of an exemplary design of a transmitter 330. For simplicity, only some circuits in transmitter 330 is shown in FIG. 3. Transmitter 330 includes a power amplifier 340, output circuits 350, a load 360, a power supply source 370, and a bypass capacitor 372. Power amplifier 340 receives and amplifies an input RF signal (RFin) and provides an amplified RF signal (RFamp). Output circuits 350 receive the amplified RF signal and provide an output RF signal (RFout) to load 360. Load 360 may include an antenna, a switchplexer, a duplexer, etc.

Power supply source 370 generates a fixed supply voltage (Vdd) for power amplifier 340. Bypass capacitor 372 is coupled between power supply source 370 and circuit ground and is used to filter undesired signals and noise in the Vdd voltage provided to power amplifier 340. Power supply source 370 has an output impedance of Zps, which is the impedance looking into the power supply source. The output impedance of power supply source 370 typically looks like an inductor at few hundred mega-Hertz (MHz). This means that the output impedance is predominantly an imaginary number, and its magnitude grows proportionately with frequency within a certain frequency range. This inductor may produce a resonance when combined with bypass capacitor 372. The resonance occurs due to the output impedance of the power supply impedance, when combined with the impedance of the bypass capacitor, producing an equivalent impedance whose magnitude grows very rapidly around a certain resonance frequency. The resonance may adversely impact the performance of power amplifier 340. For example, power amplifier 340 may exhibit low-frequency instability due to the resonance.

Figure 4:
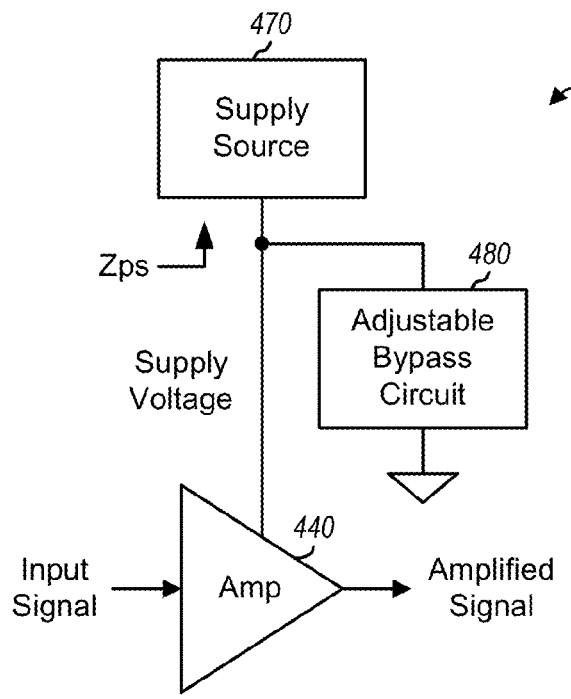
FIG. 4 shows a block diagram of a transmitter with adjustable supply voltage bypassing.

FIG. 4 shows a block diagram of an exemplary design of a transmitter 430 with adjustable supply voltage bypassing. Transmitter 430 includes an amplifier (Amp) 440, a supply source 470, and an adjustable bypass circuit 480. Amplifier 440 receives and amplifies an input signal and provides an amplified signal. Supply source 470 generates a supply voltage for amplifier 440. Adjustable bypass circuit 480 performs bypassing of the supply voltage and includes at least one adjustable circuit element.

In general, an adjustable bypass circuit may be used for an amplifier of various types in order to improve stability and performance of the amplifier. For clarity, the use of an adjustable bypass circuit for a power amplifier is described below.

Figure 5A:
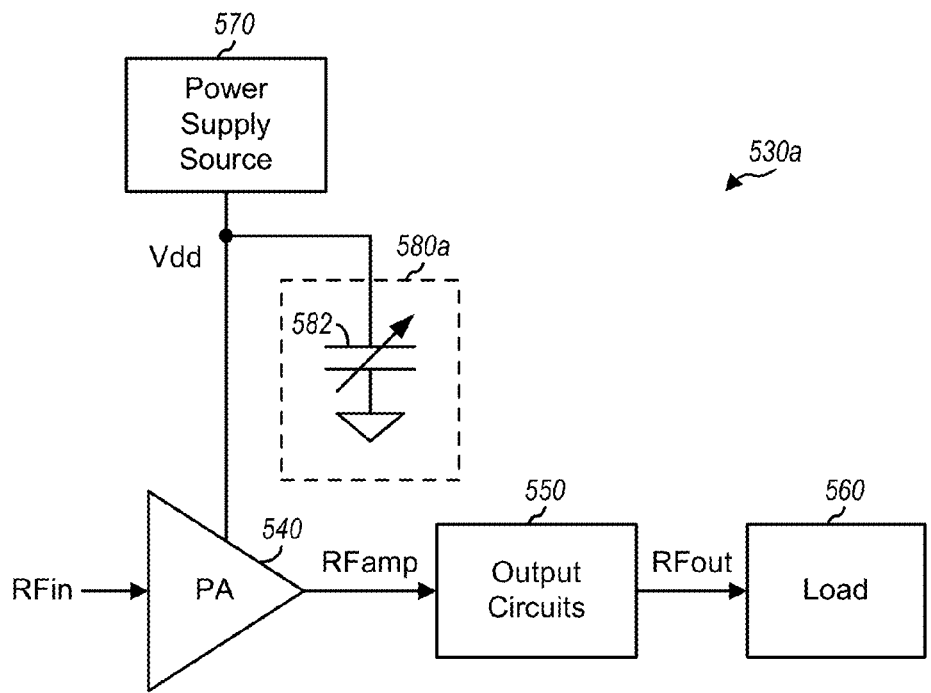
FIGS. 5A to 5C show block diagrams of three exemplary designs of a transmitter with adjustable supply voltage bypassing.

FIG. 5A shows a block diagram of an exemplary design of a transmitter 530a with adjustable supply voltage bypassing. Transmitter 530a includes a power amplifier 540, output circuits 550, a load 560, a power supply source 570, and an adjustable bypass circuit 580a. Adjustable bypass circuit 580a is one exemplary design of adjustable bypass circuit 480 in FIG. 4. Power amplifier 540 receives and amplifies an input RF signal (RFin) and provides an amplified RF signal (RFamp). Output circuits 550 receive the amplified RF signal and provide an output RF signal (RFout) to load 560. Power amplifier 540 may be any of power amplifiers 240a to 240m in FIG. 2. Output circuits 550 may be any of output circuits 250a to 250m in FIG. 2. Load 560 may include switchplexer/duplexer 252 and/or antenna 254 in FIG. 2.

Power supply source 570 generates a fixed supply voltage (Vdd) for power amplifier 540. Adjustable bypass circuit 580a performs bypassing of the Vdd voltage from power supply source 570. In the exemplary design shown in FIG. 5A, adjustable bypass circuit 580a includes an adjustable capacitor 582 coupled between power supply source 570 and circuit ground and is used to filter undesired signals and noise in the Vdd voltage provided to power amplifier 540. Power supply source 570 has an output impedance of $Z_{PS}$, which may appear inductive at few hundred MHz. Bypass capacitor 582 has a capacitance of $C_{var}$, which is variable. A resonance circuit may be formed by the inductive output impedance of power supply source 570 and bypass capacitor 582. The resonance circuit has a resonance frequency of $f_{resonance}$, which may be expressed as:

$$f_{resonance} = \frac{1}{2\pi * |Z_{PS}| * C_{var}}. \quad \text{Eq (1)}$$

As shown in equation (1), the resonance frequency of the resonant circuit formed by the output impedance of power supply source 570 and bypass capacitor 582 may be varied by adjusting bypass capacitor 582. The resonance frequency may be varied such that stability and good performance can be achieved for power amplifier 540.

It may be difficult to determine an optimal resonance frequency for power amplifier 540 in computer simulation because it may be difficult to predict the output impedance of power supply source 570. Adjustable bypass capacitor 582 may enable tuning of the resonance frequency to obtain stability and good performance for power amplifier 540.

Figure 5B:
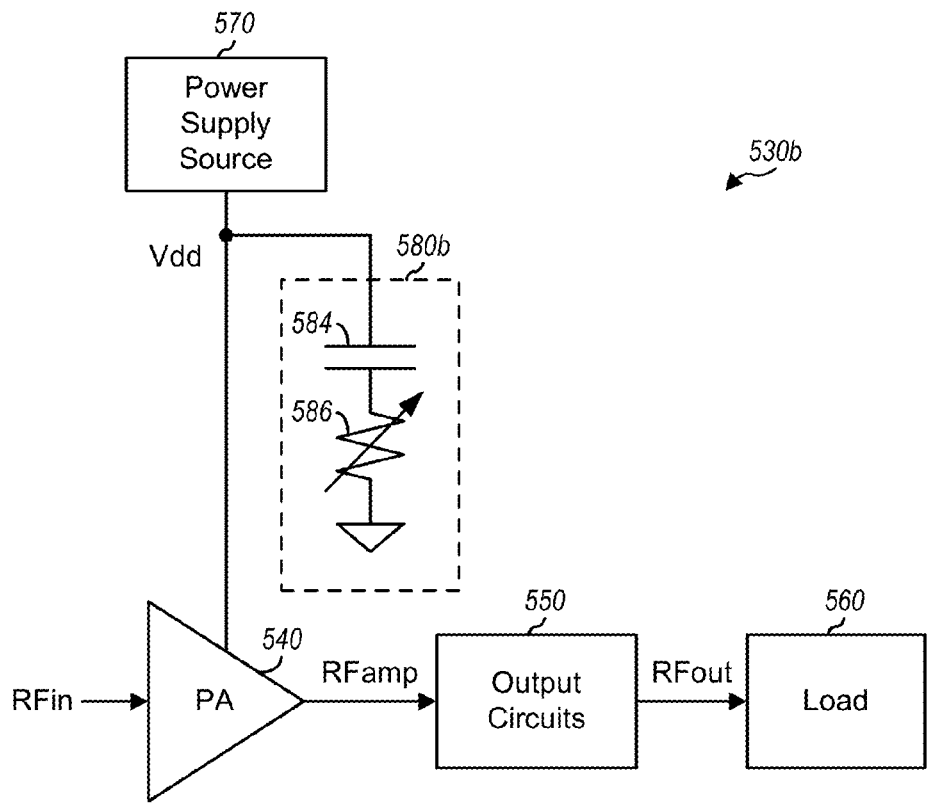

FIG. 5B shows a block diagram of an exemplary design of a transmitter 530b with adjustable supply voltage bypassing. Transmitter 530b includes power amplifier 540, output circuits 550, load 560, power supply source 570, and an adjustable bypass circuit 580b. Adjustable bypass circuit 580b is another exemplary design of adjustable bypass circuit 480 in FIG. 4. Adjustable bypass circuit 580b includes a fixed capacitor 584 and an adjustable resistor 586 coupled in series, with the series combination being coupled between power supply source 570 and circuit ground.

Power supply source 570 has an output impedance of $Z_{PS}$, which may be inductive. Bypass capacitor 584 has a fixed capacitance of $C_{fixed}$. Resistor 586 has a resistance of $R_{var}$, which is variable. A lossy resonant circuit may be formed by the output impedance of power supply source 570, bypass capacitor 584, and resistor 586. The resonance frequency of the lossy resonant circuit may be determined as shown in equation (1), albeit with $C_{var}$ being replaced with $C_{fixed}$. The quality factor (Q) of the lossy resonant circuit may be expressed as:

$$Q = \frac{|Z_{PS}|}{R_{var}}. \quad \text{Eq (2)}$$

As shown in equation (2), the Q of the lossy resonant circuit may be varied by adjusting variable resistor 586. For example, the Q may be reduced by increasing the resistance of resistor 586. Reducing the Q of bypass capacitor 584 may improve stability of power amplifier 540 but may negatively affect the performance (e.g., efficiency) of power amplifier 540. Adjustable resistor 586 may enable a suitable Q to be selected for the lossy resonant circuit to obtain stability and good performance for power amplifier 540.

Figure 5C:
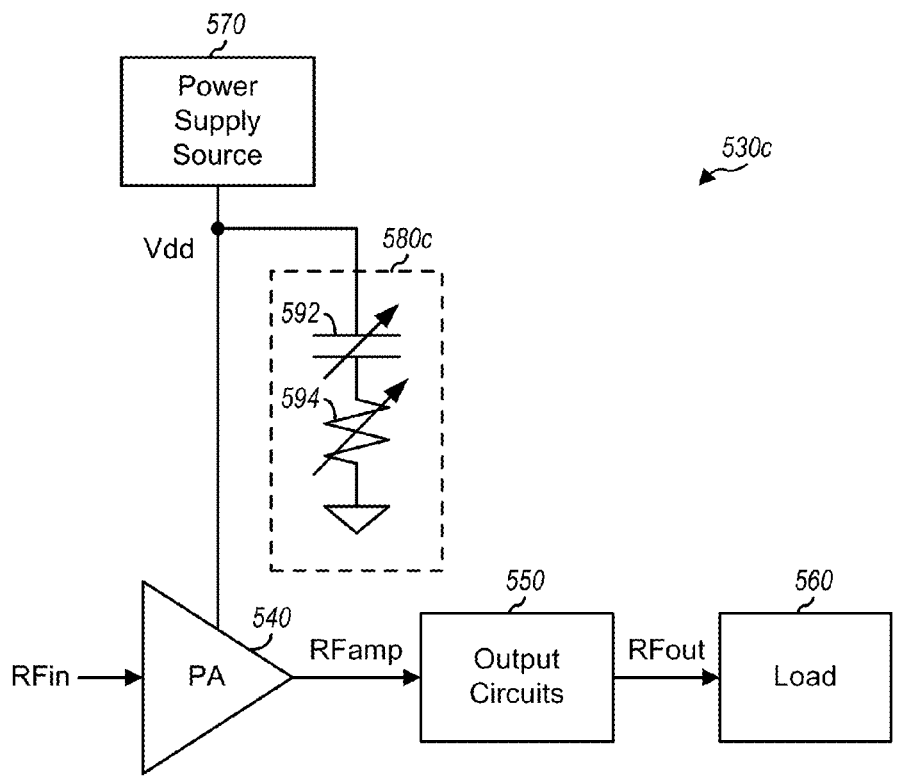

FIG. 5C shows a block diagram of an exemplary design of a transmitter 530c with adjustable supply voltage bypassing. Transmitter 530c includes power amplifier 540, output circuits 550, load 560, power supply source 570, and an adjustable bypass circuit 580c. Adjustable bypass circuit 580c is yet another exemplary design of adjustable bypass circuit 480 in FIG. 4. Adjustable bypass circuit 580c includes an adjustable capacitor 592 and an adjustable resistor 594 coupled in series, with the series combination being coupled between power supply source 570 and circuit ground.

Power supply source 570 has an output impedance of $Z_{PS}$, which may be inductive. Bypass capacitor 592 has a capacitance of $C_{var}$, which is variable. Resistor 594 has a resistance of $R_{var}$, which is variable. A lossy resonant circuit may be formed by the output impedance of power supply source 570, bypass capacitor 592, and resistor 594. The resonance frequency of the lossy resonant circuit may be determined as shown in equation (1). The Q of the lossy resonant circuit may be determined as shown in equation (2). As shown in equation (1), the resonance frequency may be varied by adjusting variable capacitor 592. As shown in equation (2), the Q may be varied by adjusting variable resistor 594 and/or variable capacitor 592. The resonance frequency and/or the Q may be varied such that stability and good performance can be achieved for power amplifier 540.

FIGS. 5A to 5C show three exemplary designs of an adjustable bypass circuit that can provide adjustable supply voltage bypassing. An adjustable bypass circuit may also be implemented in other manners. For example, a large resistor may be coupled between the power supply source and circuit ground and in parallel with adjustable capacitor 582 in FIG. 5A. As another example, a fixed bypass capacitor may be coupled between the power supply source and circuit ground and in parallel with the series combination of capacitor 584 and resistor 586 in FIG. 5B.

As shown in FIGS. 5A to 5C, a bypass circuit (e.g., bypass circuit 580a, 580b, or 580c) for a supply source (e.g., power supply source 570) may include at least one adjustable circuit element (e.g., adjustable capacitor 582 or 592 and/or adjustable resistor 584 or 594) in order to improve the performance (e.g., linearity, efficiency, etc.) and stability of an amplifier (e.g., power amplifier 540) coupled to the supply source. In general, an adjustable circuit element may be an adjustable capacitor, an adjustable resistor, or an adjustable inductor. The adjustable circuit element(s) may be varied to change the resonant frequency and/or the Q of the resonance due to an inductive output impedance of the supply source and a bypass capacitor.

The adjustable bypass circuits in FIGS. 5A to 5C may be implemented in various manners. Some exemplary designs of the adjustable bypass circuits in FIGS. 5A to 5C are described below.

Figure 6A:
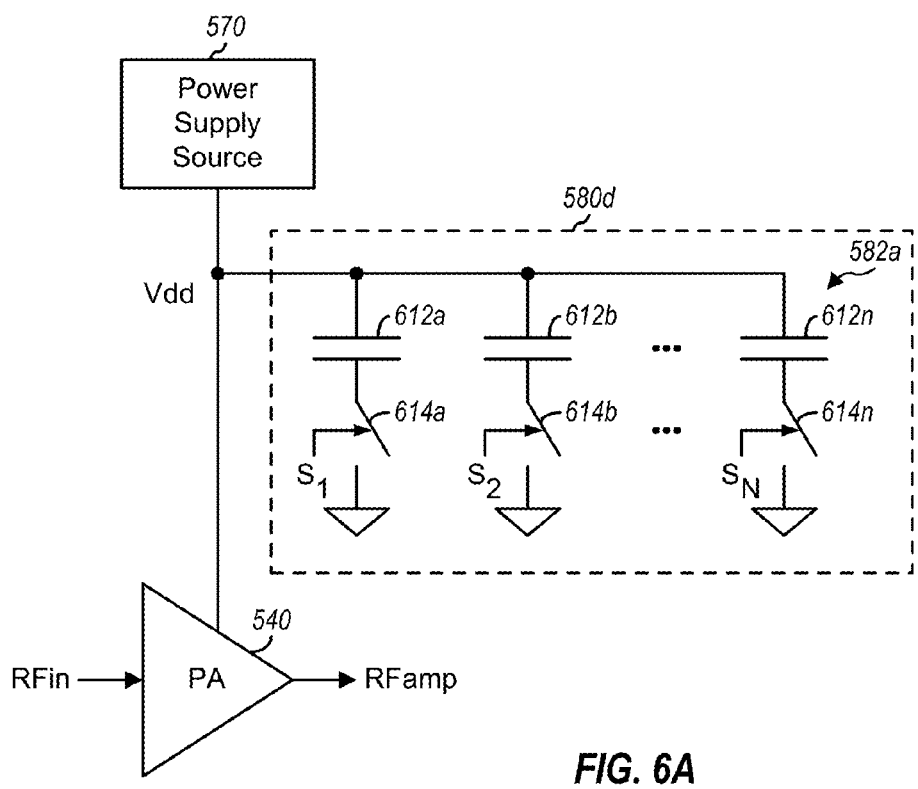
FIGS. 6A to 6D show schematic diagrams of four exemplary designs of an adjustable bypass circuit.

FIG. 6A shows a schematic diagram of an adjustable bypass circuit 580d, which is an exemplary design of adjustable bypass circuit 580a in FIG. 5A. In the exemplary design shown in FIG. 6A, adjustable bypass circuit 580d includes an adjustable capacitor 582a coupled between power supply source 570 and circuit ground. Adjustable capacitor 582a is implemented with N switchable capacitors 612a to 612n, where N may be any integer value. Each switchable capacitor 612 is coupled in series with a switch 614, and the series combination of capacitor 612 and switch 614 is coupled between power supply source 570 and circuit ground. The N switches 614a to 614n receive N control signals $S_1$ to $S_N$, respectively. Each switch 614 may be (i) closed based on its control signal to connect the associated capacitor 612 to power supply source 570 or (ii) opened based on its control signal to disconnect the associated capacitor 612 from power supply source 570. Switches 614 may be implemented with field effect transistors (FETs) or transistors of other types.

In one exemplary design, the N capacitors 612a to 612n may have the same capacitance value of C. In another exemplary design, the N capacitors 612a to 612n may have different capacitance values, e.g., C, 2C, 4C, etc. for binary weighting. In general, the N capacitors 612a to 612n may have any suitable values.

FIG. 6A shows an exemplary design in which adjustable capacitor 582a is implemented with N switchable capacitors 612. This enables adjustable capacitor 582a to be variable over a range of capacitance values including zero. In another exemplary design, a fixed bypass capacitor may also be coupled between power supply source 570 and circuit ground. The fixed bypass capacitor can provide a minimum capacitance for adjustable capacitor 582a when all switchable capacitors 612 are disconnected.

Figure 6B:
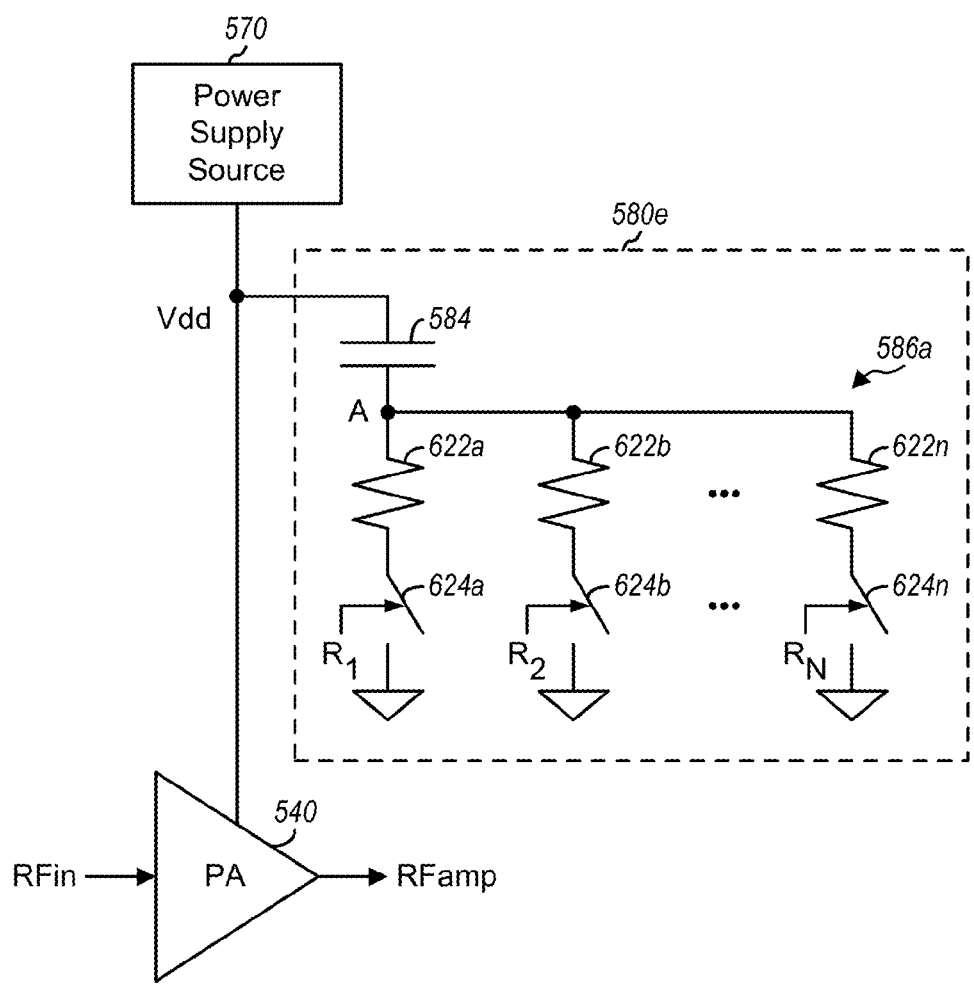

FIG. 6B shows a schematic diagram of an adjustable bypass circuit 580e, which is an exemplary design of adjustable bypass circuit 580b in FIG. 5B. In the exemplary design shown in FIG. 6B, adjustable bypass circuit 580e includes (i) fixed capacitor 584 coupled between power supply source 570 and node A and (ii) an adjustable resistor 586a coupled between node A and circuit ground. Adjustable resistor 586a is implemented with N resistors 622a to 622n coupled to N switches 624a to 624n, respectively, where N may be any integer value. Each series combination of resistor 622 and switch 624 is coupled between node A and circuit ground. The N switches 624a to 624n receive N control signals $R_1$ to $R_N$, respectively. Each switch 624 may be (i) closed based on its control signal to select the associated resistor 622 or (ii) opened based on its control signal to unselect the associated resistor 622.

In one exemplary design, the N resistors 622a to 622n may have the same resistance value of R. In another exemplary design, the N resistors 622a to 622n may have different resistance values, e.g., R, 2R, 4R, etc. for binary weighting. In general, the N resistors 622a to 622n may have any suitable values.

Figure 6C:
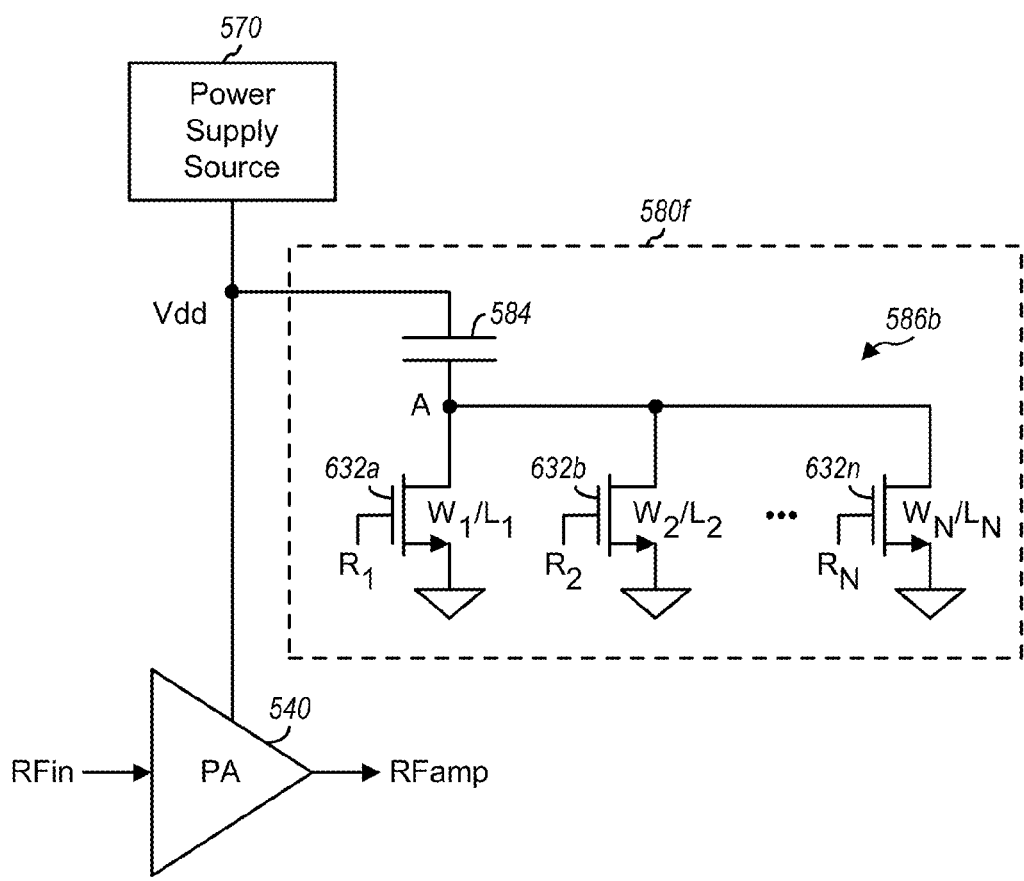

FIG. 6C shows a schematic diagram of an adjustable bypass circuit 580f, which is another exemplary design of adjustable bypass circuit 580b in FIG. 5B. In the exemplary design shown in FIG. 6C, adjustable bypass circuit 580f includes (i) fixed capacitor 584 coupled between power supply source 570 and node A and (ii) an adjustable resistor 586b coupled between node A and circuit ground. Adjustable resistor 586b is implemented with N N-channel metal oxide semiconductor (NMOS) transistors 632a to 632n, where N may be any integer value. Each NMOS transistor 632 has its source coupled to circuit ground, its drain coupled to node A, and its gate receiving a control signal for that NMOS transistor. The N NMOS transistors 632a to 632n receive N control signals $R_1$ to $R_N$, respectively. Each NMOS transistor 632 may be (i) turned on based on its control signal to provide a suitable ON resistance between node A and circuit ground or (ii) turned off based on its control signal to provide a large resistance between node A and circuit ground In one exemplary design, the N NMOS transistors 632a to 632n may have the same transistor size of W/L, where W is the width and L is the length of a transistor. A larger transistor size may provide a smaller ON resistance, and vice versa. In another exemplary design, the N NMOS transistors 632a to 632n may have different transistor sizes, e.g., $W_1/L_1$, $W_2/L_2$, ..., $W_N/L_N$ for binary weighting. In general, the N NMOS transistors 632a to 632n may have any suitable sizes, which may be determined based on the desired ON resistance.

Figure 6D:
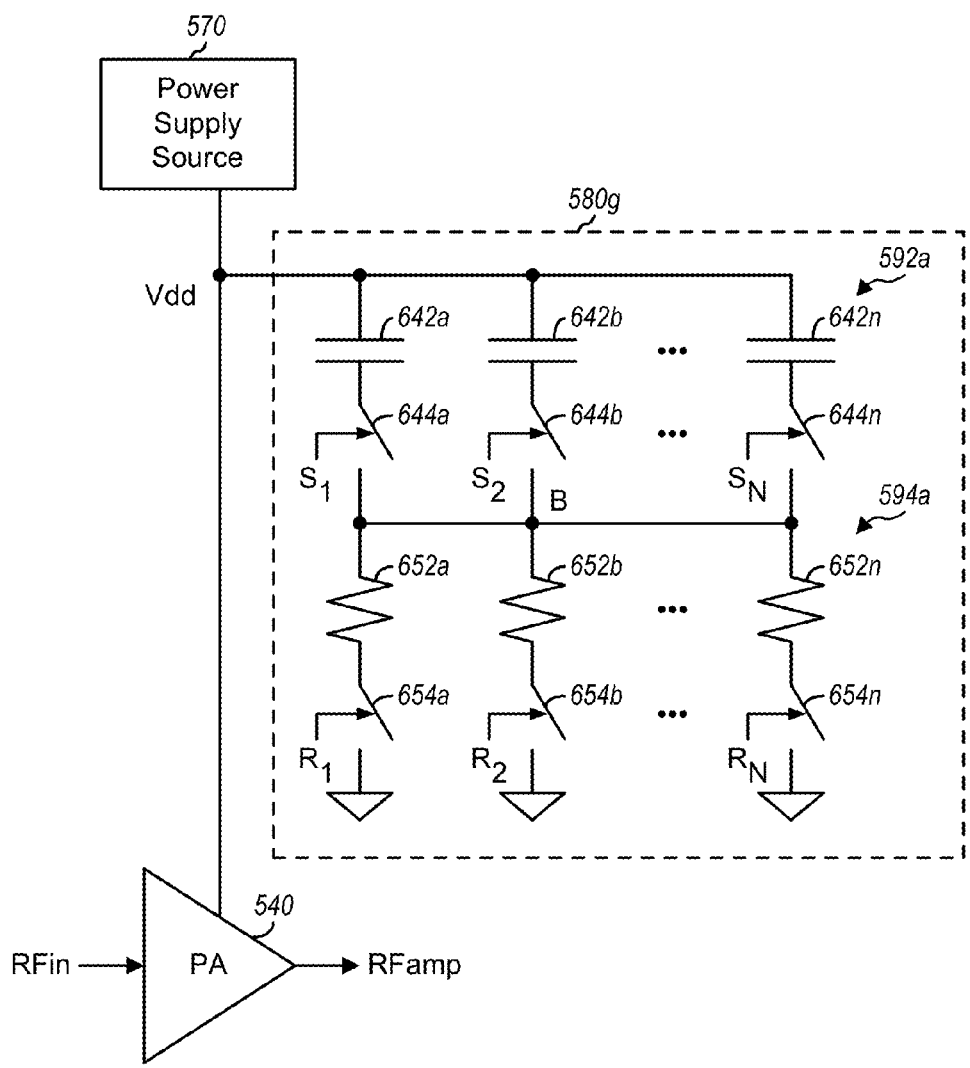

FIG. 6D shows a schematic diagram of an adjustable bypass circuit 580g, which is an exemplary design of adjustable bypass circuit 580c in FIG. 5C. In the exemplary design shown in FIG. 6D, adjustable bypass circuit 580g includes (i) an adjustable capacitor 592a coupled between power supply source 570 and node B and (ii) an adjustable resistor 594a coupled between node B and circuit ground.

In the exemplary design shown in FIG. 6D, adjustable capacitor 592a is implemented with N switchable capacitors 642a to 642n, where N may be any integer value. Each switchable capacitor 642 is coupled in series with a switch 644, and the series combination of capacitor 642 and switch 644 is coupled between power supply source 570 and node B. The N switches 644a to 644n receive N control signals $S_1$ to $S_N$, respectively. Each switch 644 may be (i) closed based on its control signal to select the associated capacitor 642 or (ii) opened based on its control signal to unselect the associated capacitor 642. The N capacitors 642a to 642n may have the same or different capacitance values.

In the exemplary design shown in FIG. 6D, adjustable resistor 594a is implemented with N resistors 652a to 652n. Each resistor 652 is coupled in series with a switch 654, and the series combination of resistor 652 and switch 654 is coupled between node B and circuit ground. The N switches 654a to 654n receive N control signals $R_1$ to $R_N$, respectively. Each switch 654 may be (i) closed based on its control signal to select the associated resistor 652 or (ii) opened based on its control signal to unselect the associated resistor 652. The N resistors 652a to 652n may have the same or different resistance values.

FIGS. 6A to 6D show some exemplary designs of an adjustable capacitor and an adjustable resistor. An adjustable capacitor may also be implemented in other manners. For example, an adjustable capacitor may be implemented with a variable capacitor (varactor) having a capacitance that can be adjusted based on an analog control signal. As another example, an adjustable capacitor may be implemented with multiple switchable capacitors coupled in series (instead of in parallel as shown in FIGS. 6A and 6D). An adjustable resistor may also be implemented in other manners. For example, an adjustable resistor may be implemented with multiple resistors coupled in series (instead of in parallel as shown in FIGS. 6B to 6D).

An adjustable circuit element (e.g., an adjustable capacitor or an adjustable resistor) in an adjustable bypass circuit may be varied in various manners. In one exemplary design, an adjustable circuit element may be adjusted based on pre-characterization. For example, stability and performance of a power amplifier may be characterized (e.g., during the circuit design phase or the manufacturing phase) for different possible values of an adjustable circuit element for each operating scenario of interest. Operating scenarios of interest may correspond to different operating frequencies, different transmit power levels, different radio technologies, etc. The setting of the adjustable circuit element that can provide the best performance with acceptable stability margins may be stored in a look-up table (e.g., in memory 212 in FIG. 2). The characterization may be performed by computer simulation, lab measurements, factory measurements, field measurements, etc. Thereafter, the setting of the adjustable circuit element that can provide the best performance for the current operating scenario may be retrieved from the look-up table and applied to the adjustable circuit element.

In another exemplary design, an adjustable circuit element in an adjustable bypass circuit may be dynamically adjusted, e.g., during operation. For example, one or more parameters such as signal power may be measured for different possible settings of an adjustable circuit element. The setting that can provide the best performance, as measured by the one or more parameters, may be selected for use.

In yet another exemplary design, an adjustable circuit element in an adjustable bypass circuit may be adjusted based on a combination of pre-characterization and dynamic adjustment. For example, the performance and stability of a power amplifier may be pre-characterized, and a setting of the adjustable circuit element that can provide good performance for the current operating scenario may be retrieved from the look-up table and applied to the adjustable circuit element. The adjustable circuit element may then be dynamically adjusted (e.g., within a more narrow range around a nominal value corresponding to the selected setting) during operation.

An adjustable circuit element in an adjustable bypass circuit may also be adjusted in other manners.

A power supply source may generate a fixed supply voltage for a power amplifier, e.g., as shown in FIGS. 3 to 6D. The fixed supply voltage may be selected based on an expected largest signal level of an amplified RF signal from the power amplifier. Using the fixed supply voltage may result in inefficiency when the amplified RF signal is smaller than the largest signal level.

FIG. 7A shows a diagram of using a fixed supply voltage for a power amplifier 740. An amplified RF signal from power amplifier 740 has a time-varying envelope and is shown by a plot 710. A power supply source 770 generates a fixed supply voltage for power amplifier 740. The fixed supply voltage is shown by a plot 720 and is higher than the largest amplitude of the amplified RF signal in order to avoid clipping of the amplified RF signal. The difference between the fixed supply voltage and the envelope of the amplified RF signal represents wasted power that is dissipated by power amplifier 740 instead of delivered to a load.

FIG. 7B shows a diagram of generating a variable supply voltage for power amplifier 740 with an envelope tracker 772. Envelope tracker 772 receives an envelope signal indicative of the envelope of the amplified RF signal and generates a variable supply voltage for power amplifier 740 based on the envelope signal. The variable supply voltage is shown by a plot 730 and closely tracks the envelope of the amplified RF signal over time. Hence, the difference between the variable supply voltage and the envelope of the amplified RF signal is small, which results in less wasted power. Power amplifier 740 may operate in saturation for all or most envelope amplitudes in order to improve power-added efficiency (PAE) of power amplifier 740.

In another aspect, an adjustable bypass circuit may be used in combination with an envelope tracker in order to improve the performance and stability of an amplifier coupled to the envelope tracker. The adjustable bypass circuit may include at least one adjustable circuit element, which may be varied to (i) change the resonant frequency of the resonance due to an inductive output impedance of the envelope tracker and a bypass capacitor, (ii) change the Q of the resonance, and/or (iii) change the total capacitance connected to the envelope tracker.

Figure 8:
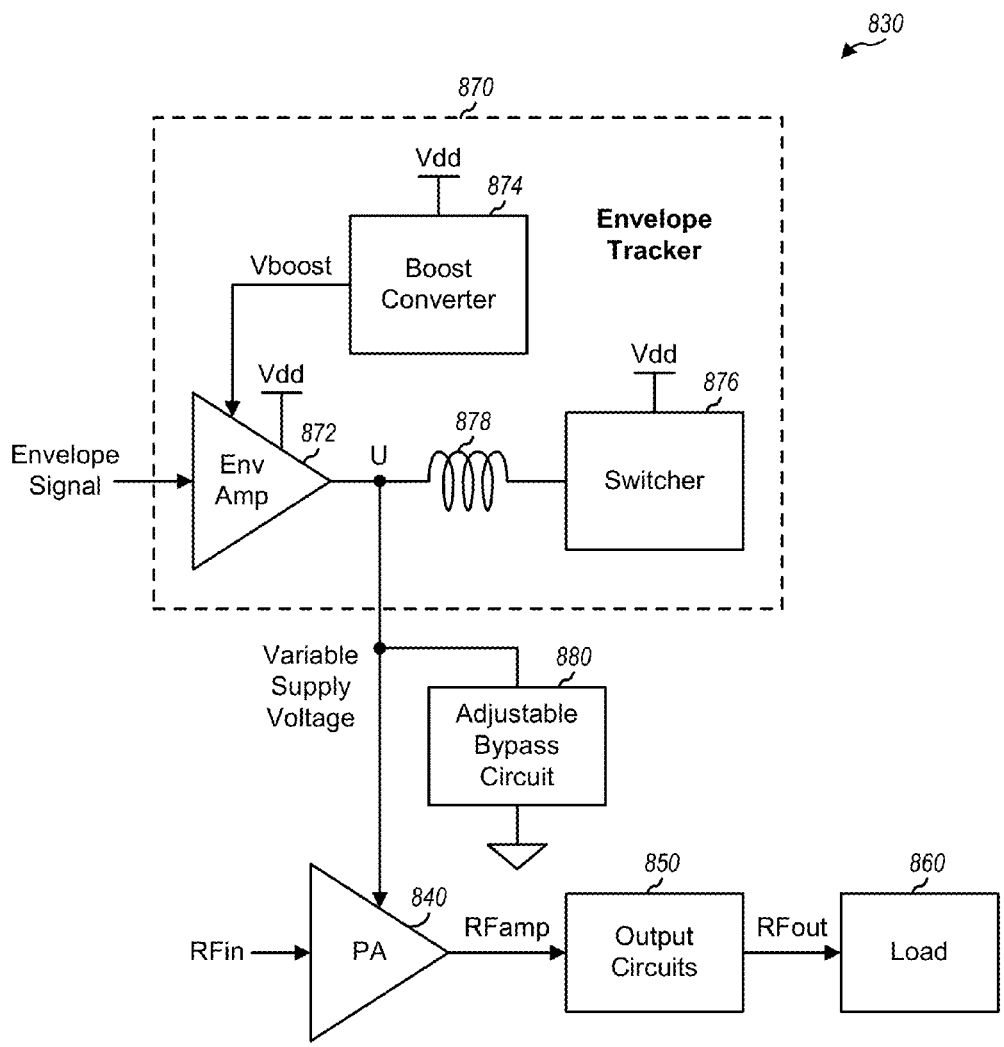
FIG. 8 shows a block diagram of a transmitter with an envelope tracker and adjustable supply voltage bypassing.

FIG. 8 shows a block diagram of an exemplary design of a transmitter 830 with adjustable supply voltage bypassing. Transmitter 830 includes a power amplifier 840, output circuits 850, a load 860, an envelope tracker 870, and an adjustable bypass circuit 880. Power amplifier 840 receives and amplifies an input RF signal and provides an amplified RF signal. Output circuits 850 receive the amplified RF signal and provide an output RF signal to load 860. Power amplifier 840 may be any of power amplifiers 240a to 240m in FIG. 2. Envelope tracker 870 generates a variable supply voltage for power amplifier 840. Adjustable bypass circuit 880 performs bypassing of the variable supply voltage from envelope tracker 870.

In the exemplary design shown in FIG. 8, envelope tracker 870 includes an envelope amplifier (Env Amp) 872, a boost converter 874, a switcher 876, and an inductor 878. Boost converter 874 receives a supply voltage (Vdd) and generates a boosted supply voltage (Vboost) that is higher than the Vdd voltage. Envelope amplifier 872 receives an envelope signal at its signal input, receives the Vdd voltage and the Vboost voltage at its two supply inputs, and provides a first supply current comprising high frequency components at node U. The envelope signal closely tracks the envelope of the amplified RF signal from power amplifier 840. Envelope amplifier 872 may operate based on the Vdd voltage when the amplified RF signal is below a particular signal level and based on the Vboost voltage when the amplified RF signal exceeds the particular signal level. Envelope amplifier 872 may also be referred to as an envelope tracking (ET) modulator.

Switcher 876 receives the Vdd voltage and provides a second supply current comprising DC and low frequency components at node U. Switcher 876 may also be referred to as a switching-mode power supply (SMPS). Inductor 878 stores current from switcher 876 and provides the stored current to node U on alternating cycles. The total supply current provided to power amplifier 840 includes the first supply current from envelope amplifier 872 and the second supply current from switcher 876. Envelope amplifier 872 also provides a proper supply voltage at node U for power amplifier 840.

FIG. 8 shows an exemplary design of envelope tracker 870. An envelope tracker may also be implemented in other manners. For example, an envelope tracker may include only an envelope amplifier, or an envelope amplifier and a switcher (but not a boost converter), etc.

Adjustable bypass circuit 880 may be implemented based on any of the exemplary designs shown in FIGS. 5A to 6D. Adjustable bypass circuit 880 may also be implemented in other manners.

An envelope tracker may be used to reduce power consumption by a power amplifier. An envelope amplifier within the envelope tracker typically includes a linear stage. The required bandwidth of the linear stage is dependent on the wireless systems supported by a wireless device and may be several or tens of MHz for WCDMA and LTE. In general, the bandwidth of the linear stage is typically limited by a capacitive load, and more bias current is typically required to achieve the same bandwidth for a larger capacitive load. The capacitive load may be dominated by on-chip bypass capacitors, which may be used to provide on-chip RF termination. The bypass capacitors may improve the performance of the power amplifier.

Adjustable bypass circuit 880 may be used for envelope tracker 870 even when only one power amplifier 840 is present, as shown in FIG. 8. When one power amplifier 840 is present, it may not be possible to use envelope tracker 870 in some applications. For example, it may not be possible to use envelope tracker 870 because (i) the same power amplifier 840 is used for both constant envelope and varying envelope applications and it is not necessary to use envelope tracker 870 in constant envelope applications, or (ii) envelope tracker 870 cannot provide the amount of current required in all applications. If envelope tracker 870 is not used for reason (i) or (ii), then power amplifier 840 may be directly connected to a primary supply source (not shown in FIG. 8) instead of envelope tracker 870. In this case, it may be desirable to vary adjustable bypass circuit 880 (e.g., vary an adjustable bypass capacitor), depending on whether power amplifier 840 is connected to envelope tracker 870 or the primary supply source.

Multiple power amplifiers may share the same envelope tracker. Each power amplifier may have a bypass capacitor coupled to the envelope tracker and located nearby to provide good RF termination for the power amplifier. In this case, the total capacitance of all bypass capacitors for the multiple power amplifiers may easily exceed the total capacitance that can be driven by an envelope amplifier with acceptable bias current consumption. This problem may be addressed in several manners. In one solution, the envelope tracker may be used for only a small number of power amplifiers (e.g., a subset of the multiple power amplifiers), and the Vdd voltage may be used for the remaining power amplifiers. In another solution, multiple envelope trackers may be used for the multiple power amplifiers, and each envelope tracker may be used for a different subset of the multiple power amplifiers. However, neither solution is as efficient as using a single envelope tracker for all power amplifiers.

In yet another aspect, multiple power amplifiers may share a common supply connection, and at least one bypass capacitor of at least one power amplifier may be connected or disconnected from the common supply connection in order to reduce the total bypass capacitance at the common supply connection. This may enable a single power supply source or a single envelope tracker to supply a fixed or a variable supply voltage for all power amplifiers. This may ease circuit design and requirements of the power supply source or the envelope tracker.

Figure 9:
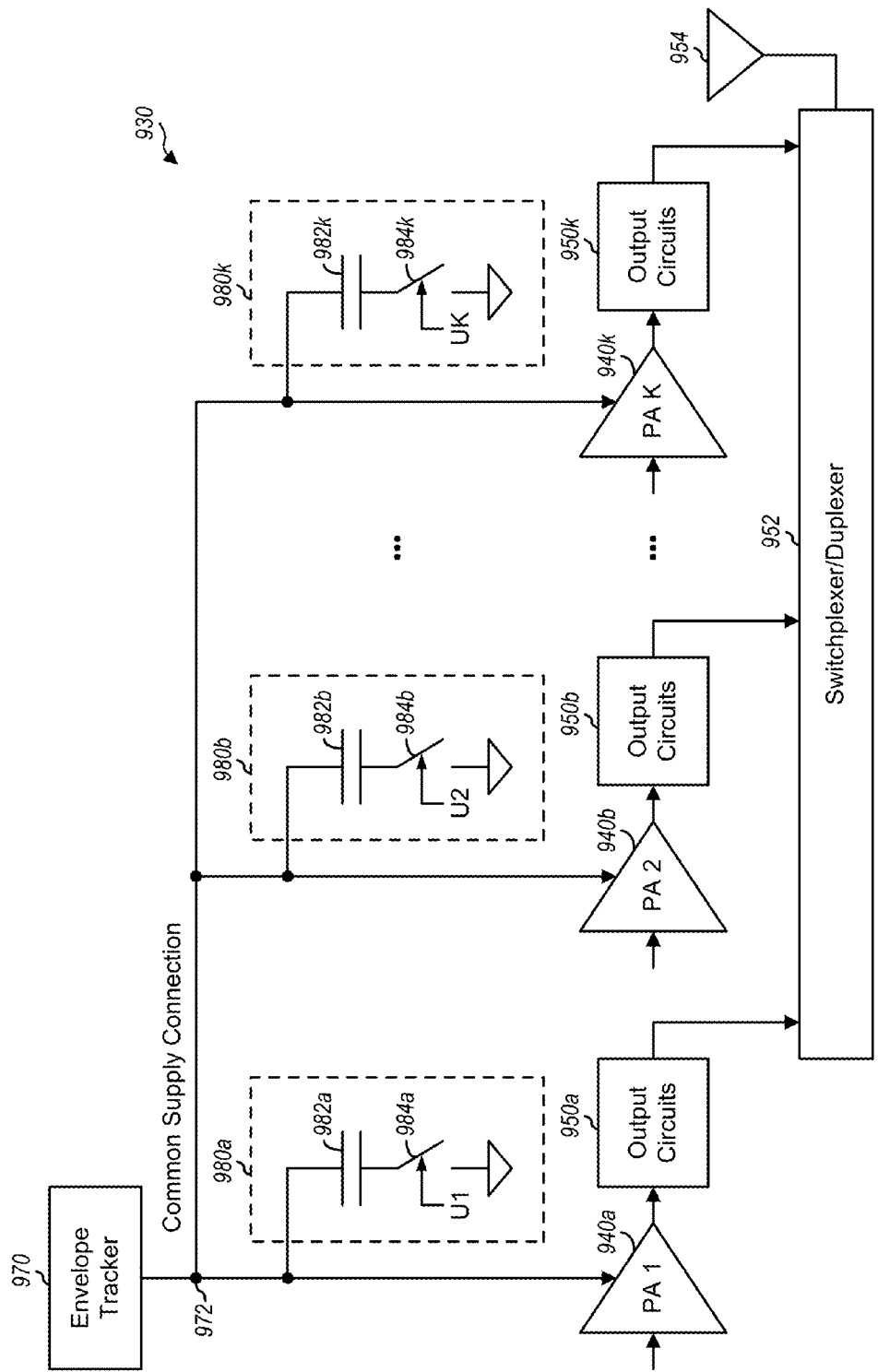
FIG. 9 shows a block diagram of a transmitter with multiple power amplifiers connected to a common supply connection and having adjustable bypass capacitance.

FIG. 9 shows a block diagram of an exemplary design of a transmitter 930 with multiple power amplifiers 940a to 940k sharing a common supply connection and having adjustable bypass capacitance. Transmitter 930 includes K power amplifiers 940a to 940k coupled to K output circuits 950a to 950k, respectively. The K output circuits 950a to 950k are further coupled to a switchplexer/duplexer 952, which is further coupled to an antenna 954.

The K power amplifiers 940a to 940k are further coupled to a common supply connection 972. An envelope tracker 970 is also coupled to common supply connection 972 and generates a variable supply voltage for an enabled/selected power amplifier. K adjustable bypass circuits 980a to 980k are also coupled to common supply connection 972 and are located near the K power amplifiers 940a to 940k, respectively. In the exemplary design shown in FIG. 9, each adjustable bypass circuit 980 includes a capacitor 982 coupled in series with a switch 984, with the series combination of capacitor 982 and switch 984 being coupled between common supply connection 972 and circuit ground.

In the exemplary design shown in FIG. 9, the bypass capacitor for each power amplifier may be switched in or out based on a control signal for that bypass capacitor. One or more power amplifiers among the N power amplifiers 940a to 940k may be enabled and turned on at any given moment. The bypass capacitor for each enabled power amplifier may be connected to common supply connection 972, and all other bypass capacitors may be disconnected from the common supply connection. Disconnecting the bypass capacitors for disabled and unused power amplifiers may reduce the total capacitive load at the common supply connection.

FIG. 9 shows an exemplary design of multiple power amplifiers sharing a common supply connection and having adjustable bypass capacitance. The power amplifiers may be coupled to an envelope tracker providing a variable supply voltage, as shown in FIG. 9. Alternatively, the power amplifiers may be coupled to a power supply source providing a fixed supply voltage (not shown in FIG. 9).

Adjustable bypass capacitance for multiple power amplifiers may also be implemented in other manners. In another exemplary design, a fixed bypass capacitor may be coupled in parallel with a switchable bypass capacitor. In this exemplary design, only a fraction of the bypass capacitance of a power amplifier may be switchable. In one exemplary design, switches may be coupled between the bypass capacitors and circuit ground, as shown in FIG. 9. In another exemplary design, the switches may be coupled between the common supply connection and the bypass capacitors (not shown in FIG. 9).

In yet another aspect, a power amplifier may be provided with either a fixed supply voltage by a power supply source or a variable supply voltage by an envelope tracker. An adjustable bypass capacitor may be used for the power amplifier.

In an exemplary design, an apparatus (e.g., a wireless device, an IC, a circuit module, etc.) may comprise an amplifier and an adjustable bypass circuit, e.g., as shown in FIGS. 5A to 5C. The amplifier (e.g., power amplifier 540 in FIGS. 5A to 5C) may receive a supply voltage from a supply source. The amplifier may comprise a power amplifier that receives an input RF signal and provides an amplified RF signal. The adjustable bypass circuit may be coupled to the supply source and may bypass (e.g., filter) the supply voltage. The adjustable bypass circuit may comprise at least one of an adjustable capacitor or a fixed capacitor coupled to an adjustable resistor.

In one exemplary design, the supply source may comprise a power supply source (e.g., power supply source 570 in FIGS. 5A to 5C) providing a fixed supply voltage for the amplifier. In another exemplary design, the supply source may comprise an envelope tracker (e.g., envelope tracker 870 in FIG. 8) providing a variable supply voltage for the amplifier. The envelope tracker may generate the variable supply voltage based on an envelope signal corresponding to the input RF signal.

In an exemplary design, the adjustable bypass circuit may comprise the adjustable capacitor (e.g., capacitor 582 in FIG. 5A) coupled between the supply source and circuit ground. The adjustable capacitor may comprise a plurality of switchable capacitors (e.g., capacitors 612 in FIG. 6A). Each switchable capacitor may be selected or unselected based on a respective control signal for the switchable capacitor.

In another exemplary design, the adjustable bypass circuit may comprise the fixed capacitor (e.g., capacitor 584 in FIG. 5B) and the adjustable resistor (e.g., resistor 586 in FIG. 5B) coupled in series and between the supply source and circuit ground. In one exemplary design, the adjustable resistor may comprise a plurality of switchable resistors (e.g., resistor 622 in FIG. 6B). Each switchable resistor may be selected or unselected based on a respective control signal for the switchable resistor. In another exemplary design, the adjustable resistor may comprise a plurality of transistors (e.g., NMOS transistor 632 in FIG. 6C). Each transistor may be selected or unselected based on a respective control signal for the transistor. Each transistor may provide an ON resistance when selected. The plurality of transistors may have different sizes and may provide different ON resistances when selected.

In yet another exemplary design, the adjustable bypass circuit may comprise the adjustable capacitor (e.g., capacitor 592 in FIG. 5C) and an adjustable resistor (e.g., resistor 594 in FIG. 5C) coupled in series and between the supply source and circuit ground. The adjustable capacitor may comprise a plurality of switchable capacitors (e.g., capacitors 642 in FIG. 6D). Each switchable capacitor may be selected or unselected based on a respective first control signal for the switchable capacitor. The adjustable resistor may comprise a plurality of switchable resistors (e.g., resistors 652 in FIG. 6D). Each switchable resistor may be selected or unselected based on a respective second control signal for the switchable resistor.

In another exemplary design, an apparatus (e.g., a wireless device, an IC, a circuit module, etc.) may comprise a plurality of amplifiers and a plurality of switchable bypass capacitors, e.g., as shown in FIG. 9. The plurality of amplifiers (e.g., power amplifiers 940 in FIG. 9) may be coupled to a common supply connection and may receive a supply voltage provided by a supply source to the common supply connection. The plurality of switchable bypass capacitors (e.g., capacitors 982 in FIG. 9) may also be coupled to the common supply connection and may be associated with the plurality of amplifiers.

Each of the plurality of switchable bypass capacitors may be associated with one of the plurality of amplifiers. Each switchable bypass capacitor may be connected or disconnected from the common supply connection. In an exemplary design, each switchable bypass capacitor may be (i) connected to the common supply connection when the associated amplifier is enabled or (ii) disconnected from the common supply connection when the associated amplifier is disabled.

In an exemplary design, a fixed bypass capacitor may also be coupled to the common supply connection and may be associated with one of the plurality of amplifiers. In general, any number of switchable bypass capacitors and any number of fixed bypass capacitors may be coupled to the common supply connection. Each amplifier may be associated with zero or more switchable bypass capacitors and zero or more fixed bypass capacitors.

In an exemplary design, the supply source may comprise an envelope tracker providing a variable supply voltage to the common supply connection, e.g., as shown in FIG. 9. In another exemplary design, the supply source may comprise a power supply source providing a fixed supply voltage to the common supply connection. The supply source may provide the supply voltage to one or more amplifiers that are enabled among the plurality of amplifiers.

Figure 10:
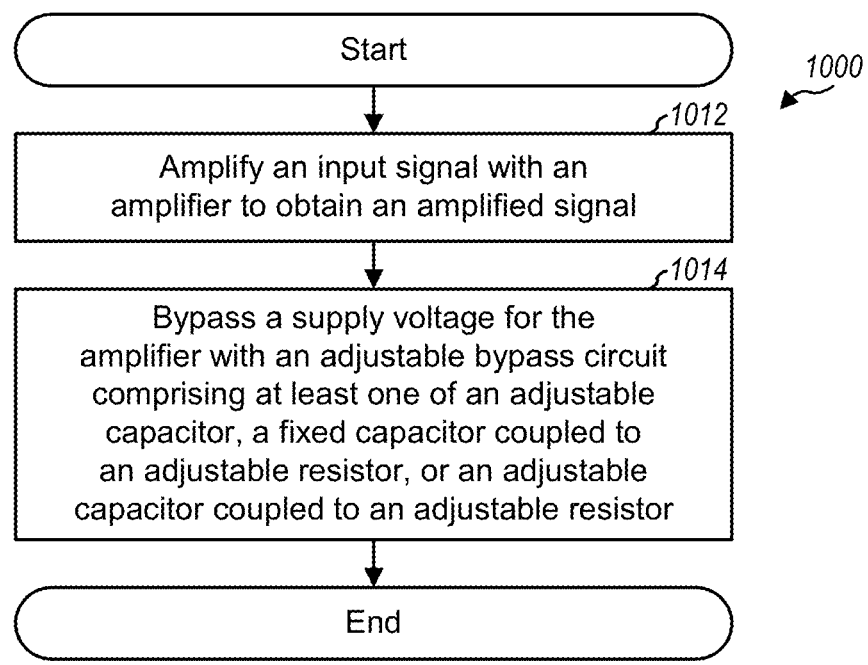
FIG. 10 shows a process for bypassing a supply voltage for an amplifier.

FIG. 10 shows an exemplary design of a process 1000 for bypassing a supply voltage for an amplifier. An input signal may be amplified with the amplifier (e.g., a power amplifier) to obtain an amplified signal (block 1012). A supply voltage for the amplifier may be bypassed with an adjustable bypass circuit comprising at least one of an adjustable capacitor, a fixed capacitor coupled to an adjustable resistor, or an adjustable capacitor coupled to an adjustable resistor (block 1014).

In one exemplary design, the supply source may comprise a power supply source that generates a fixed supply voltage. The fixed supply voltage may be provided as the supply voltage for the amplifier. In another exemplary design, the supply source may comprise an envelope tracker that generates a variable supply voltage, e.g., based on an envelope signal for the input signal. The variable supply voltage may be provided as the supply voltage for the amplifier.

An adjustable bypass circuit described herein may be implemented on an IC, an analog IC, an RFIC, a mixed-signal IC, an ASIC, a printed circuit board (PCB), an electronic device, etc. An adjustable bypass circuit may also be fabricated with various IC process technologies such as complementary metal oxide semiconductor (CMOS), NMOS, P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing an adjustable bypass circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   an amplifier configured to receive a supply voltage from a supply source; and
   an adjustable bypass circuit coupled to the supply source and configured to bypass the supply voltage, the adjustable bypass circuit comprising at least one of an adjustable capacitor or a fixed capacitor coupled in series to an adjustable resistor.

2. The apparatus of claim 1, the adjustable bypass circuit comprising the adjustable capacitor coupled between the supply source and circuit ground.

3. The apparatus of claim 2, the adjustable capacitor comprising a plurality of switchable capacitors, each switchable capacitor being selected or unselected based on a respective control signal for the switchable capacitor.

4. The apparatus of claim 1, the adjustable bypass circuit comprising the fixed capacitor and the adjustable resistor coupled in series and between the supply source and circuit ground.

5. The apparatus of claim 4, the adjustable resistor comprising a plurality of switchable resistors, each switchable resistor being selected or unselected based on a respective control signal for the switchable resistor.

6. The apparatus of claim 4, the adjustable resistor comprising a plurality of transistors, each transistor being selected or unselected based on a respective control signal for the transistor, each transistor providing an ON resistance when selected.

7. The apparatus of claim 6, the plurality of transistors having different sizes and providing different ON resistances when selected.

8. The apparatus of claim 1, the adjustable bypass circuit comprising an adjustable resistor coupled to the adjustable capacitor.

9. The apparatus of claim 8, the adjustable capacitor and the adjustable resistor are coupled in series and between the supply source and circuit ground.

10. The apparatus of claim 9, the adjustable capacitor comprising a plurality of switchable capacitors, each switchable capacitor being selected or unselected based on a respective first control signal for the switchable capacitor, and the adjustable resistor comprising a plurality of switchable resistors, each switchable resistor being selected or unselected based on a respective second control signal for the switchable resistor.

11. The apparatus of claim 1, the supply source comprising an envelope tracker configured to provide a variable supply voltage for the amplifier.

12. An apparatus comprising:
a plurality of amplifiers coupled to a common supply connection and configured to receive a supply voltage provided by a supply source to the common supply connection; and
a plurality of switchable bypass capacitors coupled to the common supply connection and associated with the plurality of amplifiers, each of the plurality of switchable bypass capacitors being connected or disconnected from the common supply connection based on an operational state of an associated amplifier of the plurality of amplifiers.

13. The apparatus of claim 12, the supply source comprising an envelope tracker configured to provide a variable supply voltage to the common supply connection.

14. The apparatus of claim 12, wherein each of the plurality of switchable bypass capacitors is associated with one of the plurality of amplifiers, and wherein each switchable bypass capacitor is connected to the common supply connection when the associated amplifier is enabled and is disconnected from the common supply connection when the associated amplifier is disabled.

15. The apparatus of claim 12, further comprising:
a fixed bypass capacitor coupled to the common supply connection.

16. A method comprising:
amplifying an input signal with an amplifier to obtain an amplified signal; and
bypassing a supply voltage for the amplifier with an adjustable bypass circuit comprising at least one of an adjustable capacitor or a fixed capacitor coupled in series to an adjustable resistor.

17. The method of claim 16, further comprising:
generating a variable supply voltage with an envelope tracker as the supply source; and
providing the variable supply voltage as the supply voltage for the amplifier.

18. An apparatus comprising:
means for amplifying an input signal to obtain an amplified signal; and
means for bypassing a supply voltage for the means for amplifying, the means for bypassing comprising at least one of an adjustable capacitor or a fixed capacitor coupled in series to an adjustable resistor.

19. The apparatus of claim 18, further comprising:
means for generating a variable supply voltage as the supply source; and
means for providing the variable supply voltage as the supply voltage for the amplifier.

\* \* \* \* \*